(12) United States Patent
Vazhenin et al.

(10) Patent No.: US 9,621,189 B2
(45) Date of Patent: Apr. 11, 2017

(54) METHOD AND APPARATUS FOR IDENTIFICATION AND COMPENSATION FOR INVERSION OF INPUT BIT STREAM IN LDPC DECODING

(71) Applicant: Topcon Positioning Systems, Inc., Livermore, CA (US)

(72) Inventors: Nikolay Afanasievich Vazhenin, Moscow (RU); Andrey Vladimirovich Veitsel, Moscow (RU); Alexey S. Lebedinsky, Moscow (RU); Ivan Andreevich Kirjanov, Moscow (RU)

(73) Assignee: Topcon Positioning Systems, Inc., Livermore, CA (US)

( * ) Notice: Subject to any disclaimer, the term of this patent is extended or adjusted under 35 U.S.C. 154(b) by 41 days.

(21) Appl. No.: 14/865,119

(22) Filed: Sep. 25, 2015

(65) Prior Publication Data
US 2016/0285475 A1    Sep. 29, 2016

(30) Foreign Application Priority Data
Mar. 25, 2015  (RU) .................... 2015110603

(51) Int. Cl.
| | |
|---|---|
| *H03M 13/00* | (2006.01) |
| *H03M 13/11* | (2006.01) |
| *H04L 1/00* | (2006.01) |
| *H03M 13/37* | (2006.01) |
| *H03M 13/45* | (2006.01) |

(52) U.S. Cl.
CPC .... *H03M 13/1111* (2013.01); *H03M 13/1128* (2013.01); *H03M 13/3723* (2013.01); *H03M 13/3746* (2013.01); *H03M 13/458* (2013.01); *H04L 1/005* (2013.01); *H04L 1/0052* (2013.01); *H04L 1/0057* (2013.01)

(58) Field of Classification Search
CPC .......... H03M 13/1111; H03M 13/3746; H03M 13/458; H04L 1/0057; H04L 1/0052
See application file for complete search history.

(56) References Cited

U.S. PATENT DOCUMENTS

| | | | |
|---|---|---|---|
| 8,370,711 B2* | 2/2013 | Alrod | H03M 13/1111 714/763 |
| 8,645,810 B2* | 2/2014 | Sharon | H03M 13/1128 714/755 |

(Continued)

*Primary Examiner* — Esaw Abraham
(74) *Attorney, Agent, or Firm* — Bardmesser Law Group

(57) ABSTRACT

Method of identification and compensation for inversion of the input bit stream when decoding LDPC codes includes obtaining a code word of the LDPC code from a demodulator output and writing the code word into a buffer memory, decoding the code word, calculating a syndrome for each iteration when decoding, making an analysis of converging the weight of the syndrome, generating an inversion feature for the input bit stream based on this analysis, continuing the decoding, if the inversion feature for the input bit stream does not give evidence of detecting inversion, resetting, if the inversion feature for the input bit stream shows inversion, the LDPC decoder and analysis parameters for the convergence of the weight of the syndrome, reading next code word from the buffer memory, and producing an inversion of this code word, and feeding the word to the decoder input to implement the next decoding operation.

9 Claims, 4 Drawing Sheets

(56) References Cited

U.S. PATENT DOCUMENTS

Figure 1:
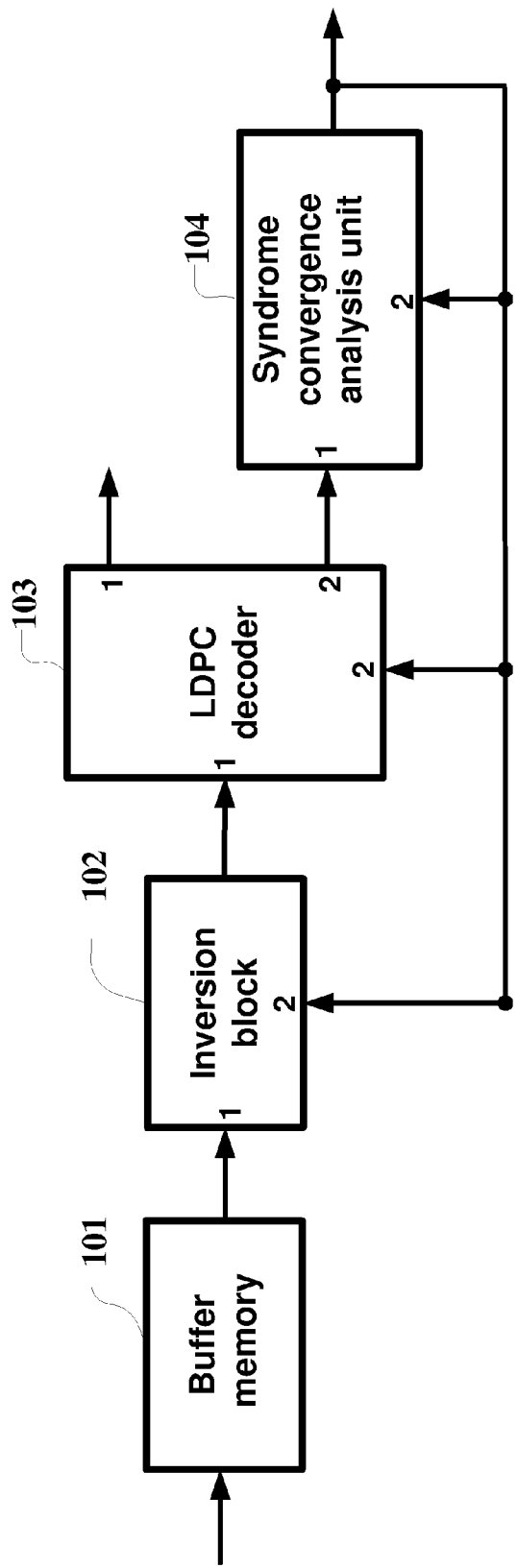

| | | | | |
|---|---|---|---|---|
| 8,732,564 B2* | 5/2014 | Chinnici | ............ | H03M 13/1111 |
| | | | | 714/752 |
| 8,745,468 B1* | 6/2014 | Zhang | ................ | H03M 13/1102 |
| | | | | 714/701 |
| 8,806,307 B2* | 8/2014 | Alrod | ................ | H03M 13/1111 |
| | | | | 714/752 |
| 8,869,000 B2* | 10/2014 | Varnica | ................ | H03M 13/29 |
| | | | | 714/755 |
| 9,118,348 B2* | 8/2015 | Maeto | ................... | H03M 13/13 |
| 9,136,875 B2* | 9/2015 | Yen | ................... | H03M 13/1105 |
| 9,407,290 B2* | 8/2016 | Fainzilber | .......... | H03M 13/1108 |

* cited by examiner

METHOD AND APPARATUS FOR IDENTIFICATION AND COMPENSATION FOR INVERSION OF INPUT BIT STREAM IN LDPC DECODING

CROSS-REFERENCE TO RELATED APPLICATIONS

This application claims priority to Russian Federation Patent Application No. 2015/110603 filed on Mar. 25, 2015, which is incorporated herein by reference in its entirety.

BACKGROUND OF THE INVENTION

Field of the Invention

The present invention relates to the field of digital signal receiving and processing systems and is intended for identification and compensation for inversion of the input bit stream in decoding LDPC (low density parity check) codes.

Description of the Related Art

The problem of identification and compensation for inversion of the input bit stream is important for communication radio systems and wireless data transmission systems.

The cause of phase inversion for the received signal with phase or amplitude-phase modulation can be jumps in phase of a phase synchronization system, based on the Costas loop, in the process of coherent demodulation of the received signal when signal-to-noise ratio is not very good.

The most efficient way to overcome non-controlled phase jumps is relative (differential) modulation methods, for example, DPSK. However in some cases, a transition from phase modulation to relative (differential) modulation is impossible. In particular, such a situation can be faced in modernizing some existing communications systems.

During a transition to iterative decoding methods, for example, LDPC (low density parity check) codes, inversion of the bit stream results in generating a large error burst/cluster in the code word, and the error correcting capability of the code may become insufficient to correct the errors. All the following code words until the next phase jump will be inverted and cannot be correctly decoded. In addition, in this case the decoder will try to perform the whole range of the permitted decoding iterations, which considerably increase system computational load.

For this purpose, the problem of identification for the fact of inversion of the bit stream is of special interest, as well as the development of its compensational methods.

There are known methods and devices of decoding LDPC codes described, for example, in U.S. Pat. No. 7,281,192, U.S. Pat. No. 7,475,103, U.S. Pat. No. 8,255,758, U.S. Pat. No. 8,381,079, U.S. Pat. No. 8,489,957, U.S. Pat. No. 8,601,352, U.S. Pat. No. 8,689,092, US Patent Publication No. 2009/0070659, US Patent Publication No. 2009/0249159, US Patent Publication No. 2014/0089766, and so on.

Also, there are known technical solutions providing identification of inversion of the input bit stream: U.S. Pat. No. 7,701,391, U.S. Pat. No. 8,255,758, US Patent Publication No. 2011/0200059, EP1324530, U.S. Pat. No. 7,221,292, U.S. Pat. No. 6,563,745, U.S. Pat. No. 7,549,011 and so on.

In U.S. Pat. No. 7,701,391, a method of coding and decoding GPS signals with LDPC codes is described. The device implementing the claimed method includes an LDPC decoder, an inversion detector/finder, and a buffer. However, the technical implementation of the inversion detector unit (numbered 510 in the document) has not disclosed in the patent, In U.S. Pat. No. 8,255,758 a method of fighting against inversion of the limited bit number is proposed when there is no successful decoding for the pre-set iteration number. A drawback of this method is a necessity of performing a great number of iterations to detect the fact of bit inversion of the code word.

US Patent Publication No. 2011/0200059 describes a method and a device providing a search for inverted bits in the received and preceded data burst with the help of an inversion indicator.

EP1324530 includes a description of a data transmission system using bit inversion and comprising an inversion detection unit, and a data inversion unit. But to detect the fact of inversion, a special inversion detection unit is used, which complicates the system implementation.

A bit inversion system is also described in U.S. Pat. No. 7,221,292 that is based on a comparison of the number of distinguishing bits in two neighboring words of the data package. However, this technical solution is based on a specific data configuration in packages and hence has a limited use.

US Patent Publication No. 2007/0118790 describes a method and device to stop iterative decoding in mobile communication systems. The method includes iterative decoding of the received signal and calculating a stop condition. A corresponding device includes an iterative decoder and units providing a calculation of the condition of decoding stop. But this method and device cannot be used in decoding LDPC codes.

The purpose of the claimed solution is to eliminate drawbacks of known technical solutions.

SUMMARY OF THE INVENTION

Accordingly, the present invention is related to a method and apparatus of identification and compensation for inversion of input bit stream in LDPC decoding that substantially obviates one or more of the disadvantages of the related art.

The proposed technical solution is directed to improving interference immunity and efficiency of computational resources for communications systems by identification and compensation for inversion of the input bit stream in decoding LDPC codes.

Digital communication systems based on LDPC codes are related to the use scope of the proposed technical solution. The technical result relates to improving interference suppression of information transfer systems due to the decrease in data lost because of inversion. In addition, the computational load is reduced, due to detecting the fact of inversion, which prevents the full permissible number of iterations from executing.

The intended purpose is achieved by analyzing the convergence of syndrome weight. If in decoding an increase in the weight of the syndrome is detected a preset number of times, a decision about detecting bit stream inversion is taken. Then, decoding of the current code word stops, the next code word is read from the buffer memory and inverted, and this word being transferred into the LDPC decoder to be decoded.

A conventional method uses an iterative decoding of the received signal and calculating a stop condition of decoding. The peculiarity of the proposed method of identification of and compensation for the inversion of the input bit stream when decoding LDPC codes is that a code word of the LDPC code is obtained from the demodulator output and written into a buffer memory, the LDPC code word is decoded, the syndrome is calculated for each iteration when decoding, a convergence of the weight of the syndrome is analyzed, an inversion feature for the input bit stream is generated based on this analysis, if the inversion feature for the input bit stream shows no evidence of detecting inversion, the decoding continues, if the inversion feature for the input bit stream shows evidence of detecting inversion, the LDPC decoder and analysis parameters for the convergence of the weight of the syndrome are reset, the next code word is read from the buffer memory, an inversion of this code word is made, and the word is fed to the LDPC decoder input to implement the next decoding operation.

In addition, the convergence analysis of the syndrome weight is implemented according to the following order:

obtaining a vector of the syndrome from the LDPC decoder for each iteration, calculating the weight of the syndrome, comparing the calculated syndrome weight with the weight from the previous iteration and generating a gain feature for the weight of the syndrome, calculating the number of weight gains over a given time interval (count window), comparing the current number of syndrome weight gains with the preset threshold level, generating an inversion feature for the input bit stream if the threshold level is exceeded (this feature is used to control the process of decoding).

The proposed method of identification and compensation for the inversion of the input bit stream when decoding LDPC codes can be implemented as a corresponding device.

The conventional device comprises an iterative decoder and units providing the calculation of a stop condition of decoding.

The proposed device of identification and compensation for the inversion of the input bit stream when decoding LDPC codes (see figures discussed below) includes a buffer memory unit 101 and a LDPC decoder 103. An inversion block 102 and a syndrome convergence analysis unit 104 are added to the LDPC decoder, the input of the buffer memory 101 being the input of the device, while the output of the buffer memory 101 being connected to the first input of the inversion block 102, the output of which is connected to the first input of the LDPC decoder 103, the first output of which is the first output of the device, the decoded information words being taken from this output, the second output of the LDPC decoder 103 is connected to the first input of the syndrome convergence analysis unit 104, the output of which is the second output of the device and is connected to the second inputs of the inversion block 102, LDPC decoder 103 and syndrome convergence analysis unit 104.

As one embodiment, the syndrome convergence analysis unit 104 includes series-connected syndrome weight calculation unit 41, comparison unit 42, counter 43 and threshold comparison unit 44, as well as size calculation window 45 and threshold generation unit 46, the first input of the syndrome weight calculation unit 41 being the first input of the syndrome convergence analysis unit 104, and the output of the threshold comparison unit 44 being the output of the syndrome convergence analysis unit 104, the second inputs of the syndrome weight calculation unit 41, comparison unit 42, counter 43 and threshold comparison unit 44 are connected to the second input of the syndrome convergence analysis unit 104, the output of the size calculation window 45 is connected to the third input of the counter 43, and the output of the threshold generation unit 46 is connected to the third input of the threshold comparison unit 44.

Additional features and advantages of the invention will be set forth in the description that follows, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE ATTACHED FIGURES

The accompanying drawings, which are included to provide a further understanding of the invention and are incorporated in and constitute a part of this specification, illustrate embodiments of the invention and together with the description serve to explain the principles of the invention.

In the drawings:

FIG. 1 presents a general diagram of the proposed device.

Figure 2:
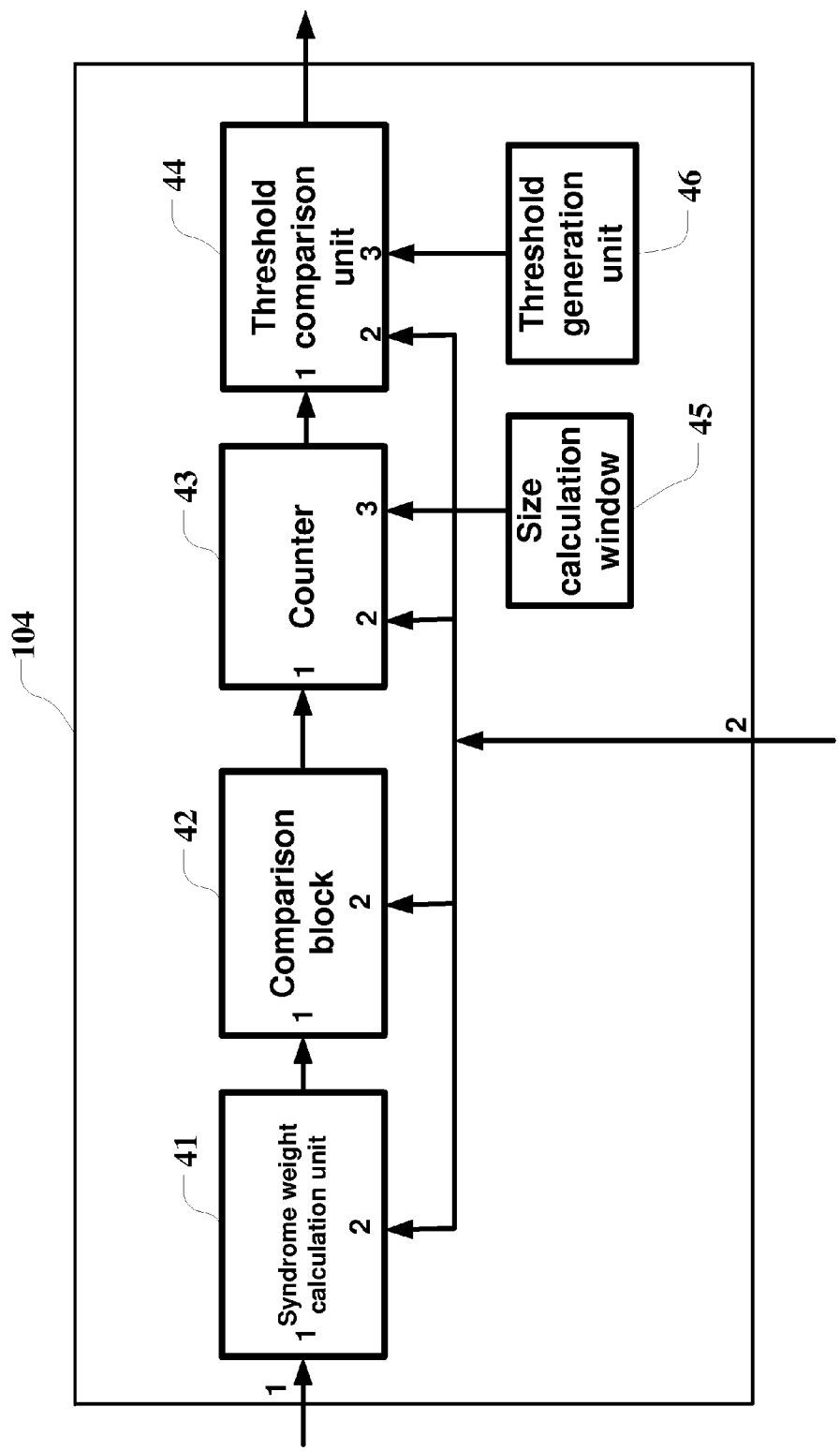

FIG. 2 shows a diagram of an embodiment for the syndrome convergence analysis block.

Figure 3:
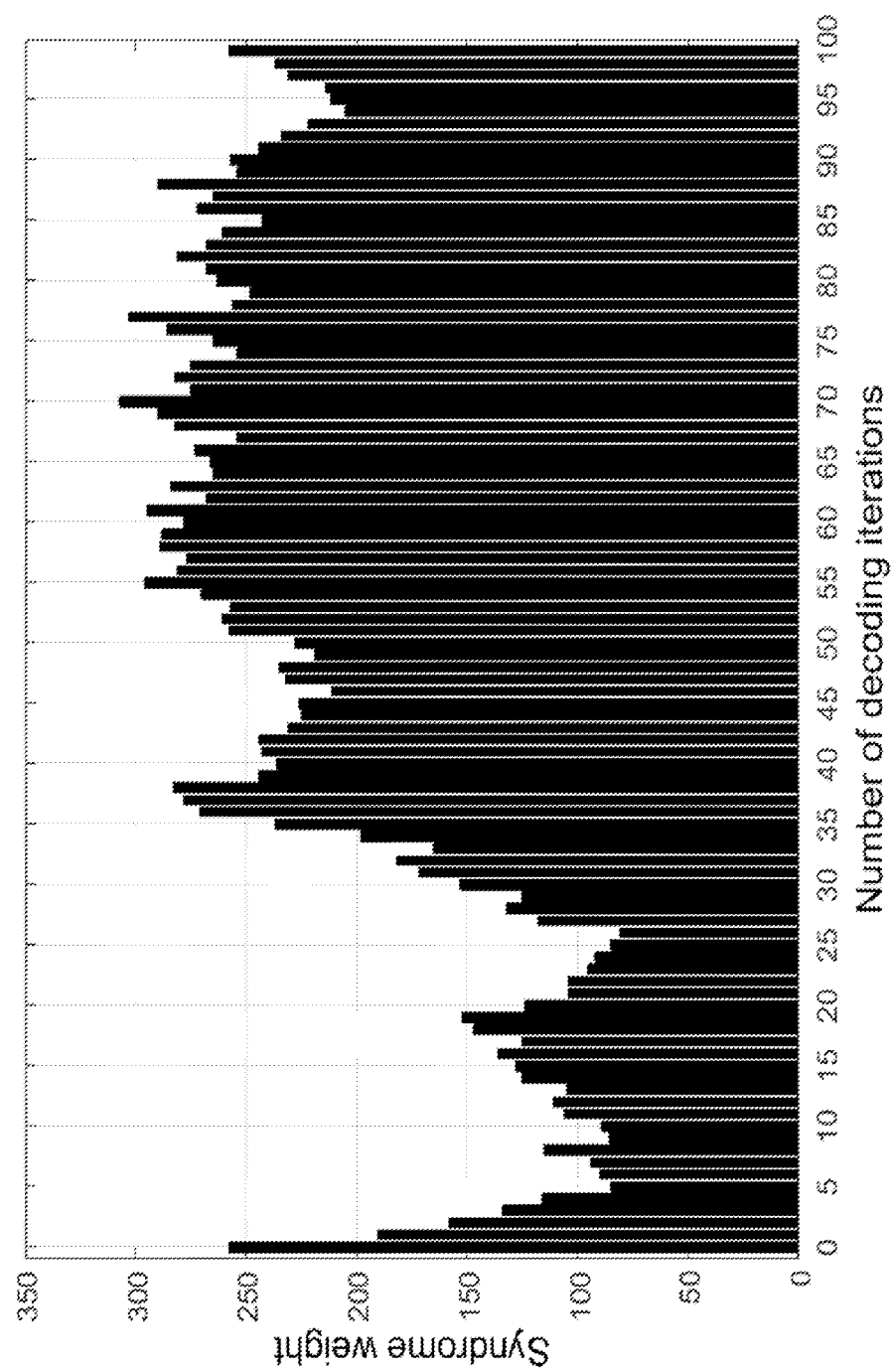

FIG. 3 presents an example of changing the weight of the syndrome in decoding depending on the iteration number, when inversion is present.

Figure 4:
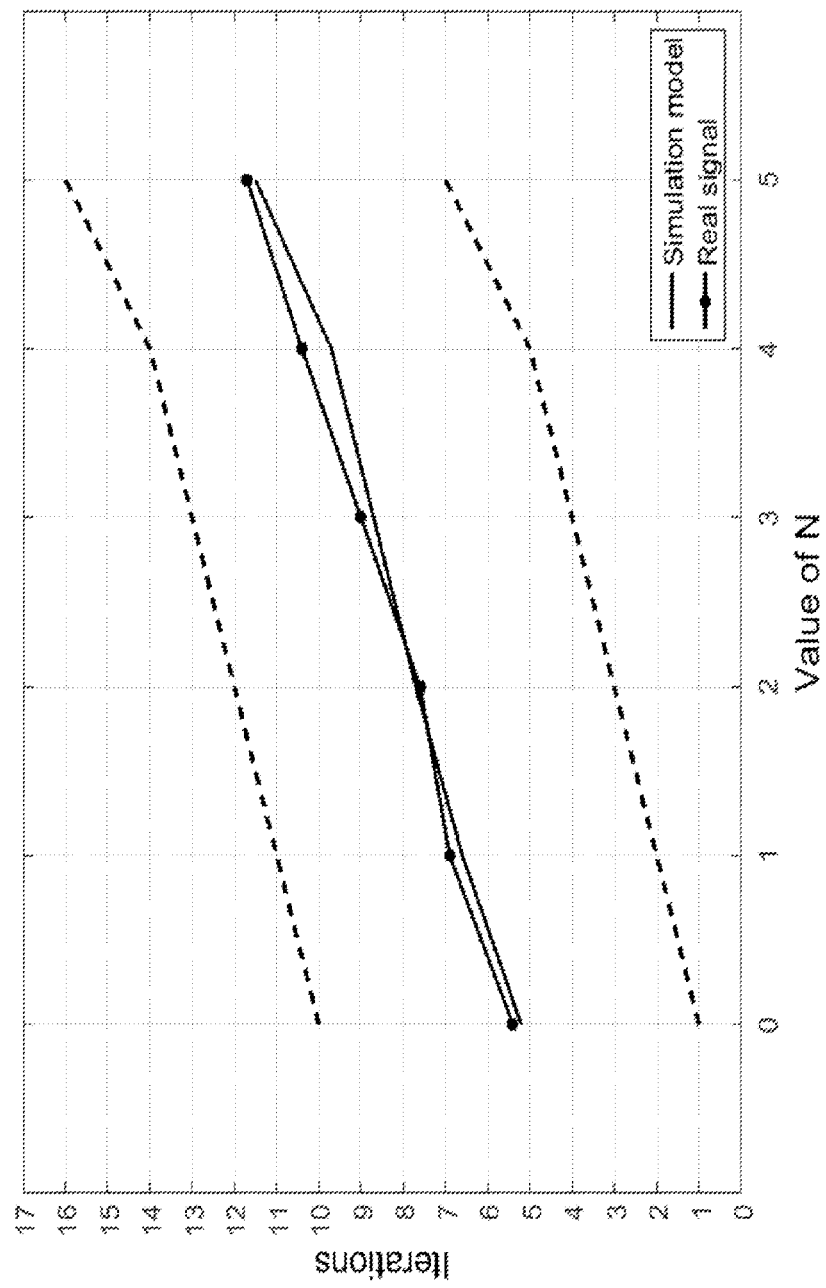

FIG. 4 shows a dependence of the average number of iterations needed for taking a decision about inversion of the bit stream upon N-value of the threshold in case of using the claimed device.

DETAILED DESCRIPTION OF THE PREFERRED EMBODIMENTS

Reference will now be made in detail to the preferred embodiments of the present invention, examples of which are illustrated in the accompanying drawings.

The proposed method of identification and compensation for inversion of the input bit stream when decoding LDPC codes includes the following operations:

obtaining an LDPC code word from the demodulator output and writing it into the buffer memory, decoding the LDPC code word, calculating a syndrome for each iteration when decoding, analyzing of converging the weight of the syndrome, generating an inversion feature for the input bit stream based on this analysis, continuing the decoding, if the inversion feature for the input bit stream shows no evidence of detecting inversion, resetting the LDPC decoder and analysis parameters for the convergence of the weight of the syndrome if the inversion feature for the input bit stream shows evidence of detecting inversion, reading the next code word from a buffer memory, and producing an inversion of this code word, and feeding the word to the LDPC decoder input to implement the next decoding operation.

The convergence analysis of the syndrome weight can be implemented according to the following order:

obtaining a vector of the syndrome from the LDPC decoder for each iteration, calculating the weight of the syndrome, comparing the calculated syndrome weight with the weight from the previous iteration and generating a gain feature for the weight of the syndrome, calculating the number of weight gains over a given time interval (count window), comparing the current number of syndrome weight gains with the preset threshold level, generating an inversion feature for the input bit stream if the threshold level is exceeded, this feature is used to control the process of decoding.

The claimed method of identification and compensation for the inversion of the input bit stream when decoding LDPC codes can be implemented in accordance with the diagrams shown in FIGS. 1-2.

LDPC code words with soft solutions are fed from the demodulator output to be sequentially decoded. These code words (FIG. 1) are written into the buffer memory 101, and then are transmitted to the LDPC decoder 103 for decoding through the inversion block 102. Each time after obtaining the control signal at the second input which corresponds to the fact of detecting phase inversion in the input bit stream, the inversion block 102 changes the sign of the input symbols of the code word. After the first or odd number of the control signals is obtained, the sign of the symbols for the output code word is changed to the opposite one, compared to that of the input code word. After the second or even numbers of the control signals, the sign of the output symbols for the code word remains the same as of the input symbols.

The code word from the output of the inversion block 102 is fed to the LDPC decoder 103, where it is iteratively decoded.

In the process of iterative decoding, for each iteration, the decoder calculates the current syndrome, which is fed to the input of the syndrome convergence analysis block 104 via the second output of the LDPC decoder 103.

Once the decoding is completed, the decoded word is fed to the first output of the LDPC decoder 103, which is the first output of the device.

In the syndrome convergence analysis block 104 (FIG. 2), based on the obtained syndrome vector, the current syndrome weight is calculated in the syndrome weight calculation unit 41. The current syndrome weight is compared in the comparison unit 42 with the similar value at the previous iteration. If the current syndrome weight is greater than that of the previous iteration, the comparison unit 42 generates an output pulse/signal. The counter 43 calculates the number of such pulses within the window set by the size calculation window 45 and counted out from the first pulse in the package being generated by the comparison unit 42. If the current time is out of the window size, the counter is reset and the calculation of the pulses starts anew.

The current value of the counter 43 is compared in the threshold comparison unit 44 with the threshold value set by the threshold generation unit 46. If the threshold is exceeded, the threshold comparison unit 44 generates a signal corresponding to detecting the inversion of the bit stream. This signal is fed to the second inputs of the inversion block 102, the LDPC decoder 103 and syndrome convergence analysis block 104, thereby providing a change in operation of the inversion block 102, a reset of the LDPC decoder 103, a reset of conditions/statuses for syndrome weight calculation unit 41, comparison unit 42, counter 43 and threshold comparison unit 44. Once this operation is completed, the system starts to decode next code word from the buffer memory 1. The output of the threshold comparison unit 44 is the output of the syndrome convergence analysis block 4 and the second output of the device intended for identification and compensation for inversion of the input bit stream when decoding LDPC codes.

A general scheme of the device for identification and compensation for inversion of the input bit stream when decoding LDPC codes is shown in FIG. 1 and comprises a buffer memory unit 101 and an LDPC decoder 103, an inversion block 102 and a syndrome convergence analysis unit 104, the input of the buffer memory 101 being the input of the device, while the output of the buffer memory 101 being connected to the first input of the inversion block 102, the output of which is connected to the first input of the LDPC decoder 103, the first output of which is the first output of the device, the decoded information words being taken from this output, the second output of the LDPC decoder 103 is connected to the first input of the syndrome convergence analysis unit 104, the output of which is the second output of the device and is connected to the second inputs of the inversion block 102, LDPC decoder 103 and syndrome convergence analysis unit 104.

The syndrome convergence analysis block 104 is made (see FIG. 2) as series-connected syndrome weight calculation unit 41, comparison unit 42, counter 43 and threshold comparison unit 44, as well as size calculation window 45 and threshold generation unit 46, the first input of the syndrome weight calculation unit 41 being the first input of the syndrome convergence analysis unit 104, and the output of the threshold comparison unit 44 being the output of the syndrome convergence analysis unit 104, the second inputs of the syndrome weight calculation unit 41, comparison unit 42, counter 43 and threshold comparison unit 44 are connected to the second input of the syndrome convergence analysis unit 104, the output of the size calculation window 45 is connected to the third input of the counter 43, and the output of the threshold generation unit 46 is connected to the third input of the threshold comparison unit 44.

The operability of the proposed technical solutions is proved by simulation results. FIG. 3 presents an example of varying syndrome weight depending on the iteration number when inversion is present. The maximal number of iteration is limited by the number of 100. It is seen that there is no convergence of the syndrome, but this fact will be found after completing 100 iterations.

FIG. 4 presents a dependence of the average iteration number necessary for reaching a decision on inversion of the bit stream with the claimed device upon N—value of the threshold in the threshold comparison unit 44 when calculating the number of excesses at the endless calculation window. It may be seen that a more efficient decision can be taken and the number of iterations can be, on average, 10 times as many.

Having thus described a preferred embodiment, it should be apparent to those skilled in the art that certain advantages of the described method and apparatus have been achieved.

It should also be appreciated that various modifications, adaptations, and alternative embodiments thereof may be made within the scope and spirit of the present invention. The invention is further defined by the following claims.

What is claimed is:

1. A method of identification and compensation for inversion of an input bit stream of LDPC (low density parity check) codes, the method comprising
    obtaining a code word of the LDPC code from a demodulator output and writing the LDPC code word into a buffer memory; and
    decoding the LDPC code word in an LDPC decoder, wherein the buffer memory, an inversion block, the LDPC decoder and a syndrome convergence analyzer are all connected in series, the buffer memory receiving the input bit stream, the LDPC decoder also outputting decoded information words at another output, and the syndrome convergence analyzer providing an output to the inversion block and to the LDPC decoder, and wherein the decoding includes:
(i) calculating a syndrome for each iteration,
(ii) in the syndrome convergence analyzer, analyzing a convergence of a weight of the syndrome,
(iii) in the inversion block, generating an inversion feature for the input bit stream based on the analyzing,
(iv) continuing the decoding if the inversion feature for the input bit stream shows no inversion,
(v) if the inversion feature for the input bit stream shows evidence of inversion, resetting the LDPC decoder and analysis parameters for the convergence of the weight of the syndrome,
(vi) reading a next code word from the buffer memory, and
(vii) inverting the next code word, and feeding the next code word to the LDPC decoder for a next decoding operation.

2. The method of claim 1, wherein the analyzing step includes:
obtaining a vector of the syndrome from the LDPC decoder for each iteration;
calculating the weight of the syndrome;
comparing the calculated syndrome weight with a weight from a previous iteration and generating a gain feature for the weight of the syndrome;
calculating a number of times the syndrome weight increased over a predetermined time interval; and
generating an inversion feature for the input bit stream if a threshold level of the number of increases of the syndrome weight is exceeded.

3. A device for compensation for inversion of an input bit stream containing LDPC (low density parity check) codes, the device comprising:
a buffer memory unit receiving the input bit stream;
an inversion block connected to the buffer memory unit;
an LDPC decoder receiving an input from the inversion block;
a syndrome convergence analysis unit receiving an input from the LDPC decoder;
wherein
the input of the buffer memory is an input of the device, while an output of the buffer memory is connected to a first input of the inversion block, an output of the inversion block is connected to a first input of the LDPC decoder, an first output of the LDPC decoder is a first output of the device representing decoded information words, a second output of the LDPC decoder is connected to a first input of the syndrome convergence analysis unit, an output of the syndrome convergence analysis unit is a second output of the device and is connected to second inputs of the inversion block, the LDPC decoder and the syndrome convergence analysis unit.

4. The device of claim 3, wherein the syndrome convergence analysis block includes:
a syndrome weight calculation unit, a comparison unit, a counter, and a threshold comparison unit, all connected in series;
a calculation window connected to the counter; and
a threshold generation unit connected to threshold comparison unit.

5. A compensator for inversion of an input bit stream containing LDPC codes, the device comprising:
a buffer memory, an inversion block, an LDPC decoder and a syndrome convergence analyzer, all connected in series, the buffer memory receiving the input bit stream;
the LDPC decoder also outputting, at another output, decoded information words from the input bit stream; and
the syndrome convergence analyzer providing an output to the inversion block and to the LDPC decoder.

6. The compensator of claim 5, wherein the syndrome convergence analyzer includes:
a syndrome weight calculator, a comparator, a counter, and a threshold comparator, all connected in series;
a calculation window connected to the counter; and
a threshold generator connected to threshold comparator.

7. The compensator of claim 5, wherein the output of the syndrome convergence analyzer is also fed back to another input of the syndrome convergence analyzer.

8. A method for compensation for inversion of an input bit stream of LDPC (low density parity check) codes, the method comprising
writing an LDPC code word into a buffer memory; and
decoding the LDPC code word in an LDPC decoder,
wherein the buffer memory, an inversion block, the LDPC decoder and a syndrome convergence analyzer are all connected in series, the buffer memory receiving the input bit stream, the LDPC decoder also outputting decoded information words at another output, and the syndrome convergence analyzer providing an output to the inversion block and to the LDPC decoder,
wherein the decoding includes:
(i) calculating a syndrome for each iteration,
(ii) in the syndrome convergence analyzer, analyzing a convergence of a weight of the syndrome,
(iii) in the inversion block, generating an inversion feature for the input bit stream based on the analyzing,
(iv) continuing the decoding if the inversion feature shows no inversion, and otherwise resetting the LDPC decoder and analysis parameters for the convergence of the weight,
(v) reading a next code word from the buffer memory, and
(vi) inverting the next code word, and feeding the next code word to the LDPC decoder for a next decoding operation.

9. The method of claim 8, wherein the analyzing step includes:
obtaining a vector of the syndrome from the LDPC decoder for each iteration;
calculating the weight of the syndrome;
comparing the calculated syndrome weight with a weight from a previous iteration and generating a gain feature;
calculating a number of times the weight of the syndrome increased over a predetermined time interval; and
generating an inversion feature for the input bit stream if a number of increases of the syndrome weight is higher than a predefined threshold.

* * * * *